(12) United States Patent
Wang et al.

(10) Patent No.: US 11,755,685 B2
(45) Date of Patent: Sep. 12, 2023

(54) APPARATUS FOR DATA PROCESSING IN CONJUNCTION WITH MEMORY ARRAY ACCESS

(71) Applicant: Piecemakers Technology, Inc., Hsinchu (TW)

(72) Inventors: Gyh-Bin Wang, Hsinchu County (TW); Ming-Hung Wang, Hsinchu (TW); Cheng-En Shieh, Taipei (TW)

(73) Assignee: Piecemakers Technology, Inc., Hsinchu (TW)

( * ) Notice: Subject to any disclaimer, the term of this patent is extended or adjusted under 35 U.S.C. 154(b) by 99 days.

(21) Appl. No.: 17/476,473

(22) Filed: Sep. 15, 2021

(65) Prior Publication Data

US 2022/0100816 A1    Mar. 31, 2022

Related U.S. Application Data

(63) Continuation-in-part of application No. 17/037,755, filed on Sep. 30, 2020, now Pat. No. 11,250,904.

(51) Int. Cl.
| | | |
|---|---|---|
| *G11C 7/10* | (2006.01) | |
| *G06F 17/16* | (2006.01) | |
| *G06F 7/544* | (2006.01) | |
| *G11C 11/408* | (2006.01) | |
| *G11C 11/4097* | (2006.01) | |
| *G11C 11/4091* | (2006.01) | |

(52) U.S. Cl.
CPC .......... *G06F 17/16* (2013.01); *G06F 7/5443* (2013.01); *G11C 7/1006* (2013.01); *G11C 11/4087* (2013.01); *G11C 11/4091* (2013.01); *G11C 11/4097* (2013.01); *G11C 7/1039* (2013.01)

(58) Field of Classification Search
CPC ... G11C 11/4096; G11C 11/4094; G11C 5/05; G11C 11/4085; G11C 11/4091
See application file for complete search history.

(56) References Cited

U.S. PATENT DOCUMENTS

| | | | |
|---|---|---|---|
| 5,822,261 A | 10/1998 | Suh | |
| 6,151,242 A * | 11/2000 | Takashima | G11C 11/22 365/230.03 |
| 6,198,682 B1 | 3/2001 | Proebsting | |
| 6,426,560 B1 | 7/2002 | Kawamura | |
| 8,812,777 B2 | 8/2014 | Cha | |
| 9,767,919 B1 | 9/2017 | He | |
| 9,870,833 B2 | 1/2018 | Lim | |
| 10,403,389 B2 | 9/2019 | Lovett | |
| 10,497,428 B2 | 12/2019 | Kim | |
| 10,956,813 B2 * | 3/2021 | Young | G11C 7/1006 |
| 11,138,499 B2 * | 10/2021 | Sharma | H10B 12/50 |
| 11,183,231 B2 | 11/2021 | Wang | |
| 2002/0093864 A1 * | 7/2002 | Ooishi | G11C 7/18 365/222 |

(Continued)

*Primary Examiner* — Mushfique Siddique
(74) *Attorney, Agent, or Firm* — Winston Hsu

(57) ABSTRACT

Page data can be propagated sequentially from a section to the neighboring section, and from this section to subsequent section adjacent to it until a page register set is reached. In a described apparatus based on this page-data-copy scheme, access data from a page register (which is also used for storing the data accessed using the page-data-copy scheme) with a conditional read-access method in conjunction with an arithmetic unit can execute the arithmetic process of an AI system.

13 Claims, 18 Drawing Sheets

(56) References Cited

U.S. PATENT DOCUMENTS

| | | |
|---|---|---|
| 2003/0086288 A1 | 5/2003 | Sekiguchi |
| 2006/0023534 A1 | 2/2006 | Do |
| 2006/0069851 A1 | 3/2006 | Chung |
| 2008/0285361 A1 | 11/2008 | Kim |
| 2009/0168576 A1* | 7/2009 | Fujita ................. G11C 11/4091 |
| | | 365/207 |
| 2011/0069568 A1 | 3/2011 | Shin |
| 2014/0063955 A1* | 3/2014 | Kawase ............ G11C 16/3454 |
| | | 365/185.12 |
| 2016/0284390 A1* | 9/2016 | Tomishima ......... G11C 11/4091 |
| 2019/0042199 A1* | 2/2019 | Sumbul ............... G11C 11/4091 |
| 2021/0157593 A1* | 5/2021 | Gu ....................... G06F 9/5027 |

\* cited by examiner

FIG. 13

APPARATUS FOR DATA PROCESSING IN CONJUNCTION WITH MEMORY ARRAY ACCESS

CROSS REFERENCE TO RELATED APPLICATIONS

This application is a Continuation-in-Part of U.S. patent application Ser. No. 17/037,755, filed 2020 Sep. 30, and included herein in its entirety.

BACKGROUND OF THE INVENTION

1. Field of the Invention

The present invention is related to memory management, and more particularly, to an apparatus for enhancing prefetch access in a memory cell array using a low-power and wide-data-access page-data-copy scheme. Furthermore, this invention is related to the apparatus based on this page-data-copy scheme, which is used for storing/latching the data accessed using the page-data-copy scheme, and from which data is accessed with a conditional read-access method. The conditionally accessed data is a pre-processing result of a processing procedure and will be sent to an arithmetic unit to complete an arithmetic process of an AI system.

2. Description of the Prior Art

A memory such as a Dynamic Random Access Memory (DRAM) may be arranged to store user data, and maximizing a goal of high bandwidth access may be regarded as one of some important considerations regarding DRAM design. However, some problems may occur in prior art schemes of data access. For example, there may be a tradeoff between a prefetch number, overall power consumption, normalized access energy efficiency (i.e. per-bit access energy) and the bank area. More particularly, without significantly increasing the bank area, conventional cell array architecture of a DRAM chip may have reached a limitation of the prefetch number. Thus, a novel architecture and method of data access is needed to solve the problem.

But even though the limitation of the maximum number of data prefetch of a memory array can be removed, an off-chip access bandwidth for data processing in another chip is still capped by the inter-chip interface. Moreover, the energy consumed for driving the inter-chip interface will incur additional power consumption and heat-dissipation issues which will limit the system performance further. In relation to this, using the disclosed novel memory architecture and special data access scheme, in conjunction with a near-site-positioned arithmetic processing unit, can achieve a high bandwidth and short dataflow, which is needed to solve the problems.

SUMMARY OF THE INVENTION

As a solution to these problems, a memory-based apparatus is proposed. The apparatus includes a set of page registers connected to an edge section of a memory cell array from which data is accessed and into which data is written based on a page-copy scheme and a processing block comprising a processing element and the page registers, wherein data can be conditionally or natively accessed from the page registers. The accessed data processed by a processing element can then be copied to the page registers of the processing block or to the page registers in the neighboring processing block enabling the flexibility and possibility to complete the following arithmetic operations in an AI system.

The memory cell array may comprise row decoders and page register decoders coupled to the memory cell array and through predetermined decoding sequences of the decoders, matrix-vector multiplication (MV), matrix-matrix multiplication (MM) or in-place convolution (CONV) are accomplished in conjunction with the arithmetic operations executed in the processing element. The page registers, the processing element, and the memory cell array may be embedded in a same semiconductor chip or may be implemented in at least two different semiconductor chips and are coupled to each other through inter-chip bonding methodologies.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 13 illustrates replacement of multiplication by addition when multiplying vectors.

DETAILED DESCRIPTION

Figure 1:
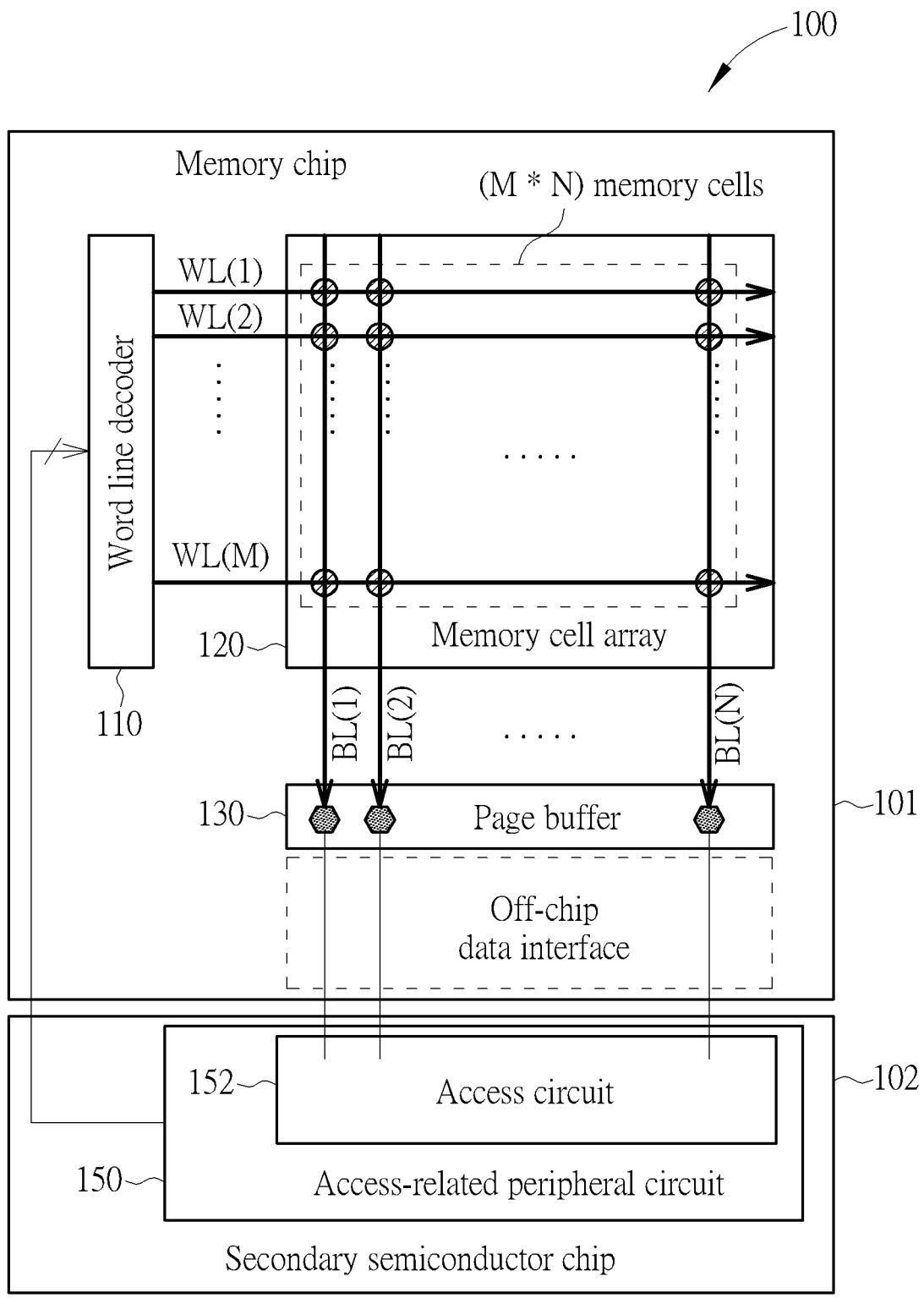
FIG. 1 is a diagram of an apparatus for enhancing data access in a memory module according to an embodiment of the present invention

FIG. 1 is a diagram of an apparatus for enhancing data access (e.g. read/write/move) in a memory (e.g. a DRAM, etc.) module 100 according to an embodiment of the present invention, where the apparatus may comprise at least one portion (e.g. a portion or all) of the memory module 100. For example, the apparatus may comprise partial memory architecture of the memory module 100. For another example, the apparatus may comprise a combination of the partial memory architecture and associated control mechanism. For yet another example, the apparatus may comprise the whole of the memory module 100.

As shown in FIG. 1, the memory module 100 may comprise a memory bank 101 and a secondary semiconductor chip 102, and the memory bank 101 may comprise a word line decoder 110, a memory cell array 120 comprising a plurality of memory cells such as (M*N) memory cells (e.g. M and N may represent positive integers, respectively), and a plurality of bit lines and a plurality of word lines that are respectively coupled to the memory cell array 120, such as N bit lines {BL(1), BL(2), BL(N)} and M word lines {WL(1), WL(2), WL(M)} coupled to the (M*N) memory cells, but the present invention is not limited thereto. According to some embodiments, except for word line drivers, the word line decoder 110 can be, in part at least, implemented in the secondary semiconductor chip 102. For example, a word line decoder pre-stage of the word line decoder 110 may be implemented on the secondary semiconductor chip 102 and a word line decoder end-stage (which may comprise the word line drivers) of the word line decoder 110 may be implemented on the memory bank 101.

The memory bank 101 may further comprise a plurality of bit-line sense amplifiers (BLSAs) coupled to the memory cell array 120 through the plurality of bit lines, respectively, such as N BLSAs of a page buffer 130, and a plurality of main data lines coupled to the N BLSAs of the page buffer 130, where the plurality of main data lines may serve as an off-chip data interface of the memory bank 101. For example, the secondary semiconductor chip 102 may be electrically connected to the memory bank 101 through direct face-to-face attachment, but the present invention is not limited thereto. In addition, the secondary semiconductor chip 102 may comprise an access-related peripheral circuit 150, and the access-related peripheral circuit 150 may comprise an access circuit 152. For example, the secondary semiconductor chip 102 may comprise a plurality of secondary amplifiers positioned in the access circuit 152.

The memory cell array 120 may be arranged to store data for a host system, and the memory module 100 may be installed in the host system. Examples of the host system may include, inter alia, a multifunctional mobile phone, a tablet computer, and a personal computer such as a desktop computer and a laptop computer. The plurality of bit lines such as the N bit lines {BL(1), BL(2), BL(N)} and the plurality of word lines such as the M word lines {WL(1), WL(2), WL(M)} may be arranged to perform access control of the memory cell array 120. According to this embodiment, the plurality of BLSAs may be arranged to sense a plurality of bit-line signals restored from the plurality of memory cells such as the (M*N) memory cells, and convert the plurality of bit-line signals into a plurality of amplified signals, respectively.

Some implementation details regarding the access control of the memory cell array 120 may be described as follows. According to some embodiments, the word line decoder 110 may decode an access control signal thereof (e.g. a row select signal) to determine whether to select (e.g. activate) a row of memory cells corresponding to a word line WL(m) (e.g. the index "m" may represent an integer falling within the interval [0, M]), where the word line decoder 110 may play a role of a row decoder regarding the access control of the memory cell array 120.

Regarding the architecture shown in FIG. 1, the apparatus may comprise the memory bank 101 that is positioned in the memory module 100, but the present invention is not limited thereto. For example, the apparatus may further comprise the secondary semiconductor chip 102. According to some embodiments, in addition to the memory bank 101, the memory module 100 may comprise at least one portion (e.g. a portion or all) of the secondary semiconductor chip 102. For example, one or more other circuits with any functionalities outside the memory module 100 may be integrated into the secondary semiconductor chip 102.

According to some embodiments, the architecture shown in FIG. 1 may vary. For example, the memory cell array 120 may be divided into a plurality of cell array (CA) sections according to a predetermined bit-line length, for enhancing the access speed, and the plurality of BLSAs (e.g. the N BLSAs in the page buffer 130) may be divided into a plurality of BLSA sections coupled to the plurality of cell array sections, correspondingly, for performing the associated sensing operations.

Figure 2:
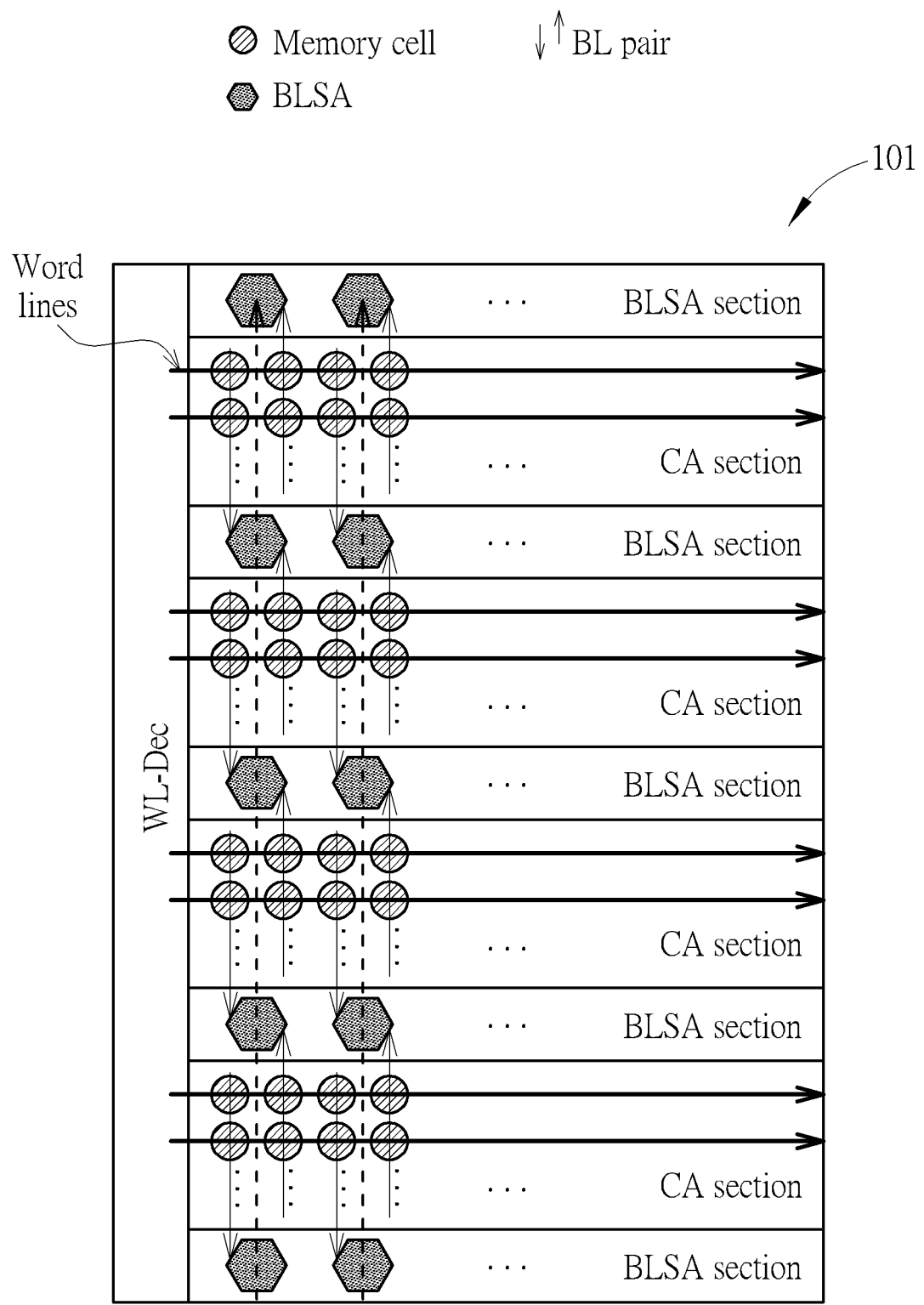
FIG. 2 illustrates some cell array sections alternating with some BLSA sections of the memory module shown in FIG. 1 according to an embodiment of the present invention.

FIG. 2 illustrates some cell array sections alternating with some BLSA sections of the memory module shown in FIG. 1 according to an embodiment of the present invention. The CA sections and the BLSA sections in the architecture shown in FIG. 2 may be taken as examples of the plurality of cell array sections and the plurality of BLSA sections mentioned above. In addition, any two of the CA sections may be the same or similar to each other, and any two of the BLSA sections may be the same or similar to each other.

Figure 3:
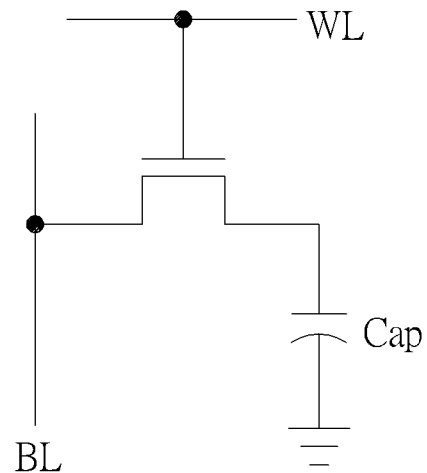
FIG. 3 illustrates a 1T1C memory cell of the memory module shown in FIG. 1 according to an embodiment of the present invention.

FIG. 3 illustrates a 1T1C (one transistor, one capacitor) memory cell (for example, in a form of DRAM cell) of the memory module 100 shown in FIG. 1 according to an embodiment of the present invention. This memory cell may be taken as an example of any memory cell (e.g. each memory cell) of the plurality of memory cells of the memory cell array 120. As shown in FIG. 3, the memory cell may comprise a switch (e.g. a transistor such as a Metal Oxide Semiconductor Field Effect Transistor (MOSFET)) coupled to a certain word line (WL) (e.g. the word line WL(m)) of the plurality of word lines and a certain bit line (BL) (e.g. the bit line BL(n)) of the plurality of bit lines, and comprise a capacitor Cap. The capacitor Cap may be arranged to store electric charge, and different states of the electric charge may indicate a bit of information (e.g. 0 or 1), but the present invention is not limited thereto. Some embodiments may also utilize a 2T2C (two transistor, two capacitor) memory cell to increase reliability. Those in the art know normal structure and functioning of a 2T2C memory cell.

Figure 4:
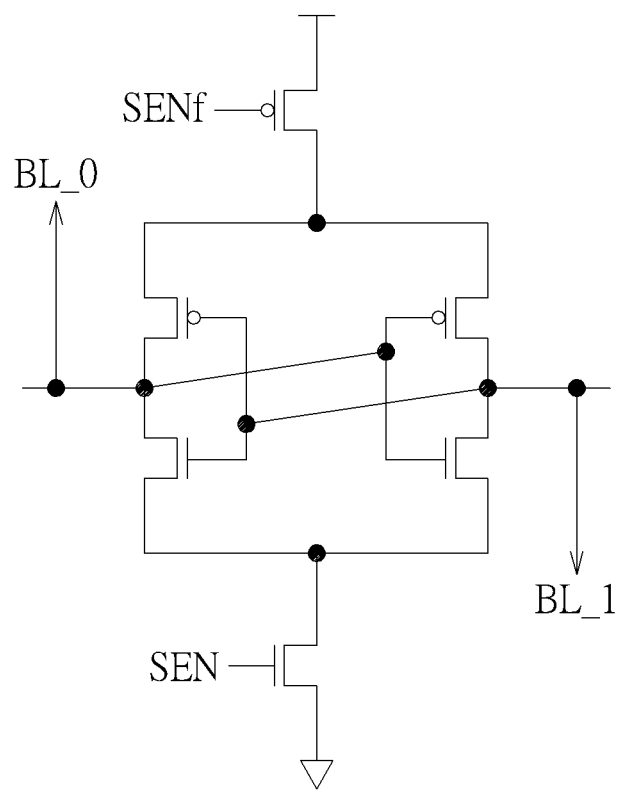
FIG. 4 illustrates a BLSA of the memory module shown in FIG. 1 according to an embodiment of the present invention.

FIG. 4 illustrates a BLSA of the memory module 100 shown in FIG. 1 according to an embodiment of the present invention. As shown in FIG. 4, the BLSA may be considered a latch and comprise two cross-connected inverters. More particularly, the two cross-connected inverters may each be coupled to two bit lines (labeled "BL_0" and "BL_1" for better comprehension) of the plurality of bit lines. The two bit lines may be respectively coupled to different memory cells of different CA sections (e.g. two CA sections adjacent to a certain BLSA section comprising this BLSA), and may be taken as an example of any BL pair of the BL pairs mentioned above. Each inverter of the inverters may be driven between a set of driving signals such as two driving signals SENf and SEN.

The BLSA may operate according to the two driving signals SENf and SEN, to obtain respective bit information (voltages), respectively, where the memory module 100 (e.g. the memory bank 101) may select any of the plurality of memory cells according to the access control signals of the word line decoder 110. For example, in a first phase of a read phase, the BLSA may obtain the bit information of a memory cell through the BL_0, and more particularly, amplify a signal carrying the bit information of the memory cell. For another example, in a second read phase of these read phases, the BLSA may obtain the bit information of a second memory cell of the two memory cells through the second bit line such as BL_1, and more particularly, amplify a second signal carrying the bit information of the second memory cell.

Control of the BLSAs is managed by the two driving signals SENf and SEN. Because the application is directed toward movement of data a page at a time, where a page is defined as data stored in all memory cells activated by a same single word line, column select lines and data lines are not necessary, saving costs, chip area, and complexity. Instead, by sequentially activating adjacent BLSA sections, data present in a first BLSA will be copied to a next sequential BLSA. In embodiments of the application, a page of data can be propagated from a source location to a target location in either direction perpendicular to the word lines.

For example, voltages loaded onto the bit lines in a first CA section can be latched by enabling the BLSA between the first section and a second section adjacent to the first section causes latched voltages to propagate to bit lines in the second section. Voltages propagated to the bit lines in the second section using the latches between the second section and a third section different than the first section and adjacent to the second section cause the latched voltages to propagate to bit lines in the third section. Using this method of sequentially activating BLSAs, voltages can be propagated sequentially from section to subsequent adjacent section until a target location is reached. Voltages can be loaded onto the bit lines by activating the appropriate word line to read source voltages or source voltages may be provided by the data access circuit 152.

Thus, a read activates the word line at the source location loading voltages from the memory cells at the source location onto the corresponding bit lines where they may be latched through activation of the adjacent BLSA. From there, voltages can be propagated sequentially from section to subsequent adjacent section until a target location is reached, whether the target location is the data access circuit 152 or another CA section in the case of a move. A move and/or a write requires activation of the word line of the target section once the data has been moved to the bit lines of that target section to store the data into the associated memory cells.

Figure 5:
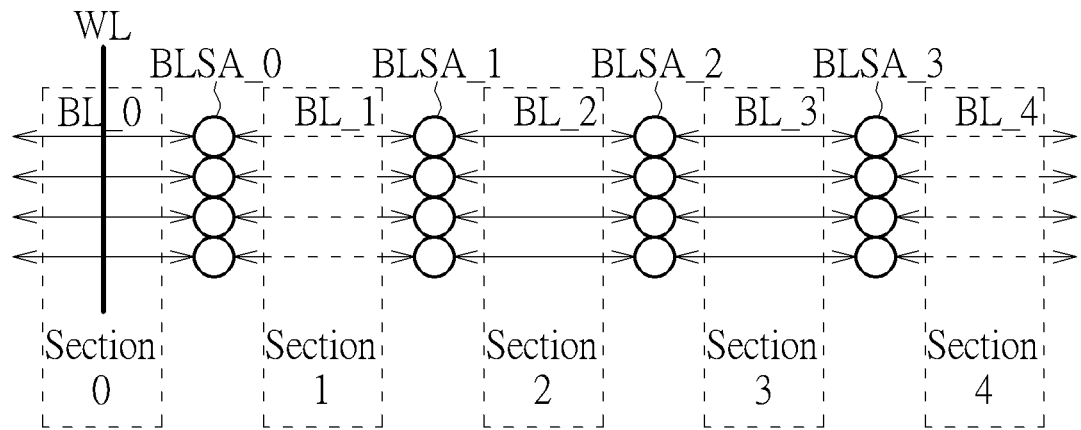
FIG. 5 illustrates an inter-section page-data-copy scheme according to some embodiments.
Figure 5:
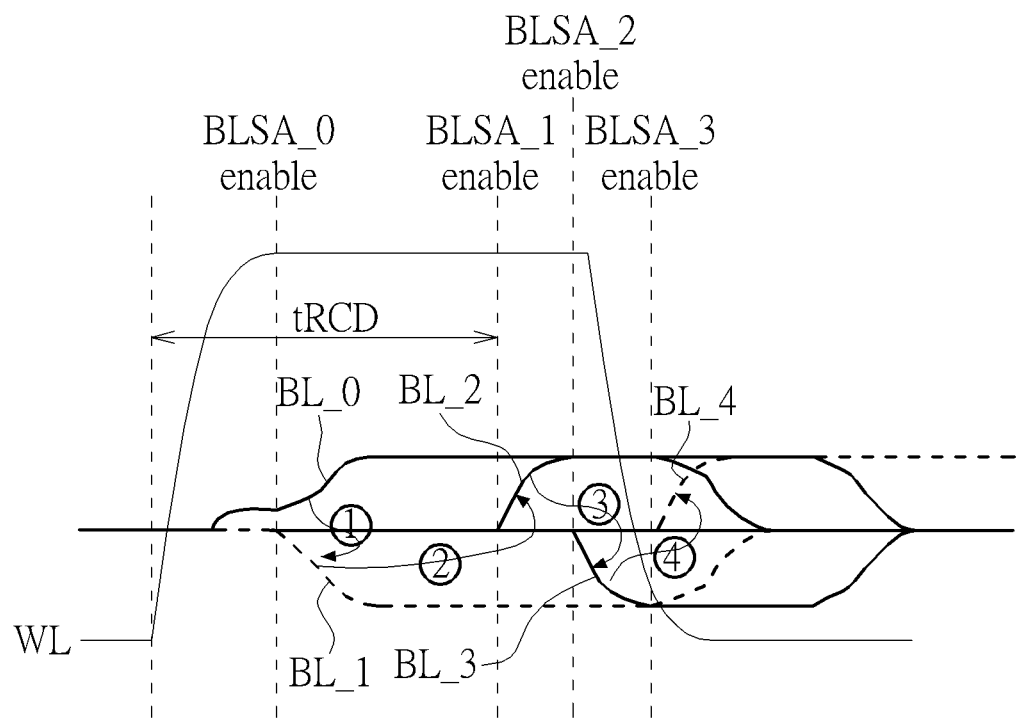

FIG. 5 illustrates the disclosed inter-section page-data-copy scheme according to some embodiments. The top half of FIG. 5 shows a functional view of a portion of an example memory bank. The CA sections are outlined in dotted lines and numbered 0-4. Each CA section contains a word line, although only one is shown in FIG. 5. A BLSA section BLSA_0-BLSA_3 is disposed between each of the CA sections, and each BLSA is connected to the adjacent CA sections via bit lines, shown here as BL_0-BL_3.

As shown in FIG. 5, after BLSA_0 is enabled (i.e. SENf-0v, SEN-VDD), page data is sensed out from the cells of an open word line and also copied from CA section 0 to CA section 1 (identified in the figure by a circled number 1). Then, after BLSA_1 is enabled, page data is copied from CA section 1 to CA section 2 (identified in the figure by a circled number 2). Next, after BLSA 2 is enabled, page data is copied from CA section 2 to CA section 3 (identified in the figure by a circled number 3). Finally, after BLSA_3 is enabled, page data is copied from CA section 3 to CA section 4 (identified in the figure by a circled number 4).

Figure 6A:
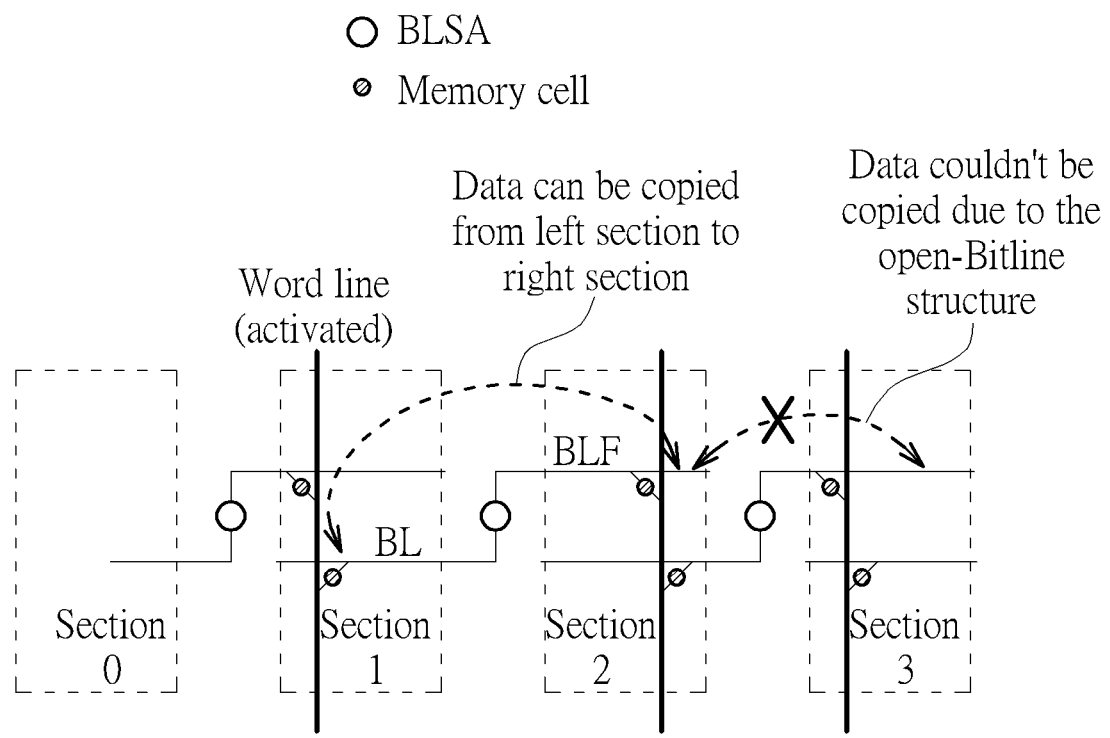
FIGS. 6a and 6b illustrate data copy in a conventional open-bit-line array of memory sections alternating between 1T1C architecture and 2T2C architecture.
Figure 6B:
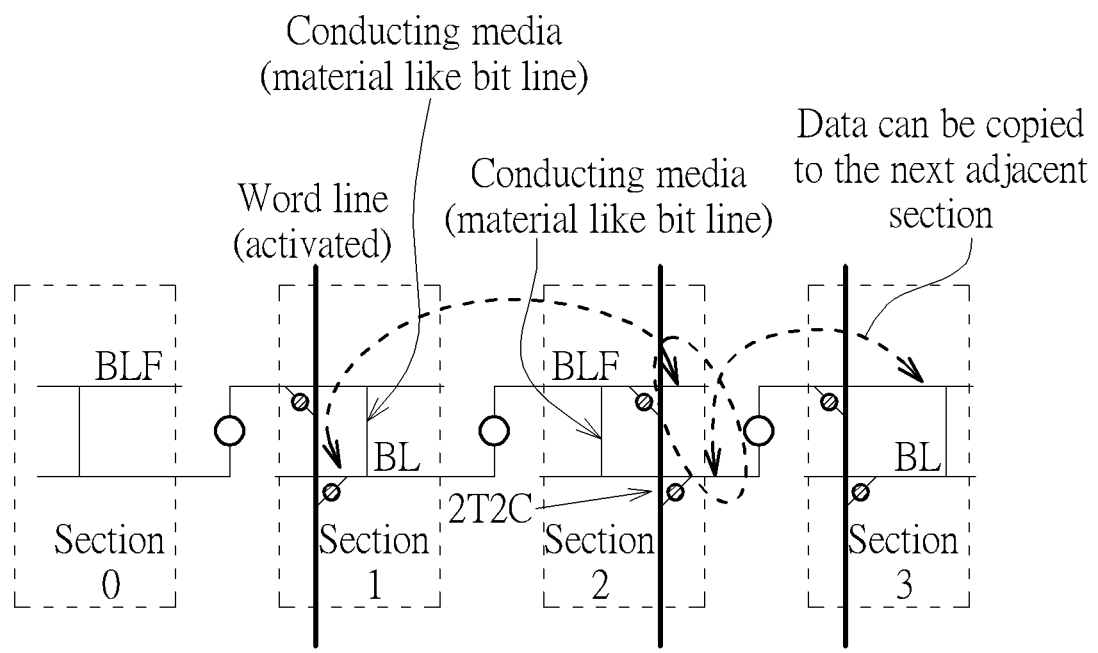
Figure 6C:
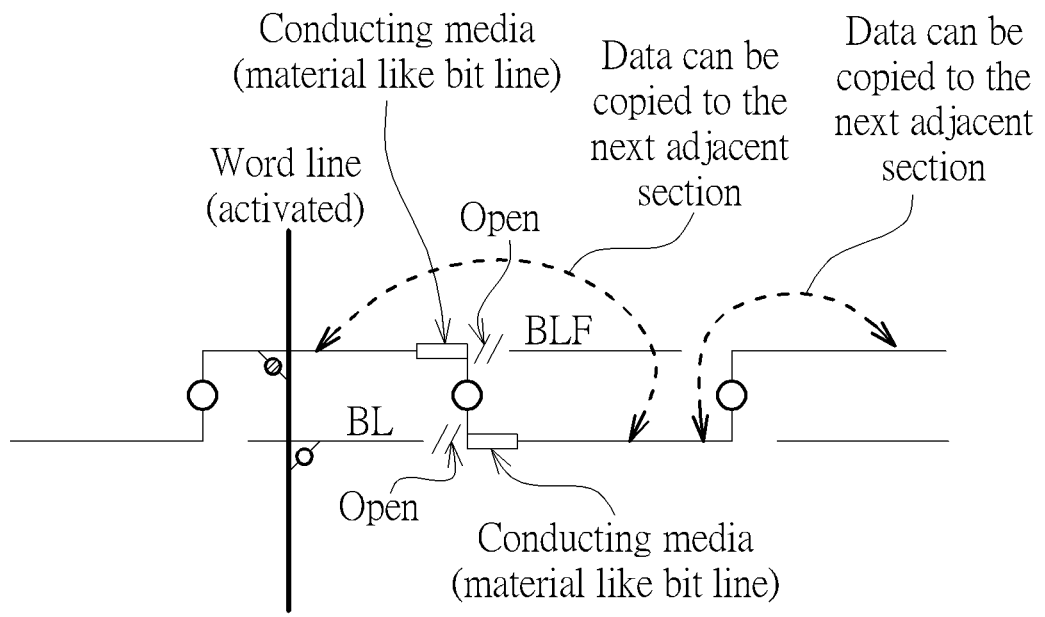
FIG. 6C illustrates data copy in a 1T1C cell array (modified from a conventional 1T1C open-bitline array).

FIGS. 6a and 6b illustrate data copy in a conventional open-bit-line array of memory sections alternating between 1T1C architecture and 2T2C architecture. The disclosed data copy scheme may fail (for example from CA section 2 to CA section 3 in FIG. 6a) in the conventional open-bit-line array shown in FIG. 6a because the data cannot always be copied due to the open-bit-line structure. To solve this problem, FIG. 6b shows a structural modification of the open-bit-line array by forming an electrical link connecting the first and second bit lines in each memory cell. This modification ensures that the data stored in a preceding BLSA will always be available to a subsequent BLSA regardless of whether the data is present on the bit line BLF or BL because it will always be present on both. FIG. 6C illustrates data copy in a 1T1C cell array (modified from a conventional 1T1C open-bitline array).

Figure 7A:
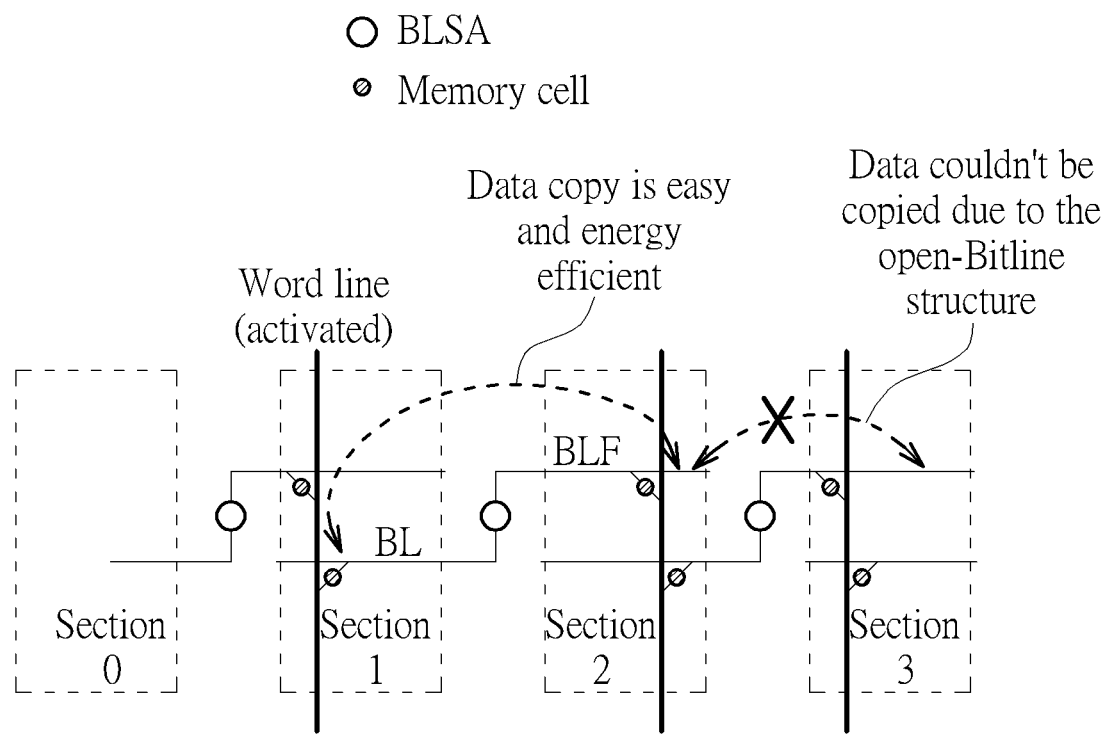
FIGS. 7a and 7b illustrate data copy in another conventional open-bit-line array of memory sections.
Figure 7B:
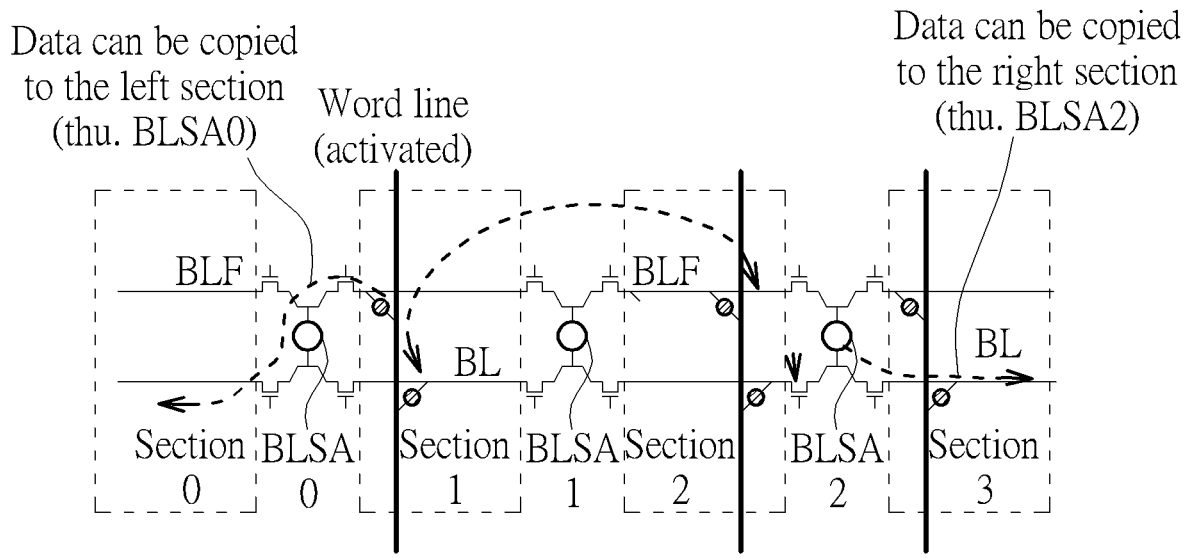

FIGS. 7a and 7b illustrate data copy in another conventional open-bit-line array of memory sections. As with the previous embodiment of FIG. 6a/6b, the disclosed data copy scheme may fail (for example from CA section 2 to CA section 3 in FIG. 7a) in the conventional open-bit-line array shown in FIG. 7a because the data cannot always be copied due to the open-bit-line structure. To solve this problem, FIG. 7b shows another possible structural modification of the open-bit-line array. In FIG. 7b, each BLSA is connected to four transistors, each transistor having a first terminal, a second terminal, and a control terminal. A first bit line in one memory section is coupled to the first terminal of the first transistor, the second terminal of the first transistor, a first node, the first terminal of the second transistor, the second terminal of the second transistor, and a first bit line in the adjacent memory section in series as shown in FIG. 7b. A second bit line in the one memory section is coupled to the first terminal of the third transistor, the second terminal of the third transistor, a second node, the first terminal of the fourth transistor, the second terminal of the fourth transistor, and a second bit line in the adjacent memory section in series, and a BLSA is coupled to the first node and to the second node also as shown in FIG. 7b. Each of the four transistors can be controlled to electrically connect the BLSA with bit lines BLF and BL in the adjacent CA sections, ensuring the desired propagation of data voltages.

Figure 8:
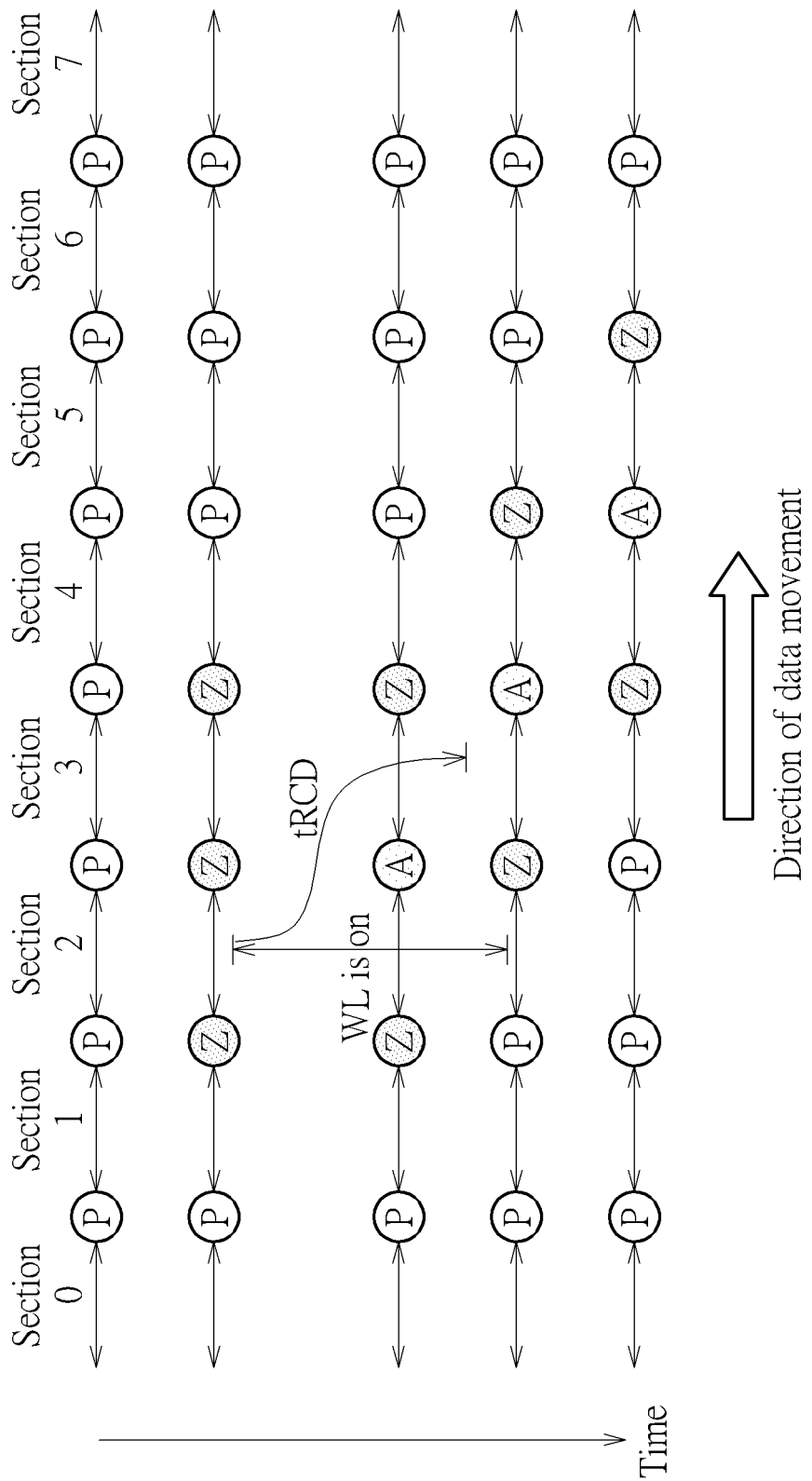
FIG. 8 shows an example operation of a data copy in a conventional open-bit-line array with inter-sectional movement of page data.

FIG. 8 shows an example operation of a data copy in a conventional open-bit-line array with inter-sectional movement of page data. In FIG. 8, time shifts from top to bottom in the drawing, and data is copied from the left to the right as time progresses. In FIG. 8, after precharging the memory cells in CA section 2, the word line in CA section 2 is activated, reading and amplifying data from the memory cells and latching the data (labeled as "A" in the drawings) in the appropriate BLSA. As shown, the word line can then be turned off. When the subsequent BLSA is activated, the data "A" is copied from the current BLSA to the subsequent BLSA as shown. The BLSA activation process continues, propagating the data "A" from one BLSA to a next BLSA until a target location is reached.

Some of the benefits of this page-copy scheme include:
1. Harvesting the maximum pre-fetch of data a DRAM array can provide.
2. Potentially discarding the use of data line sense amplifiers and saving the power consumption of an unnecessary column select line decoder.

3. Power savings due to the inherent voltage half swing for bit lines BL and BLF.
4. Accommodating a BL-before-WL page-data write scheme to achieve very fast and low-power data writing.

Figure 9:
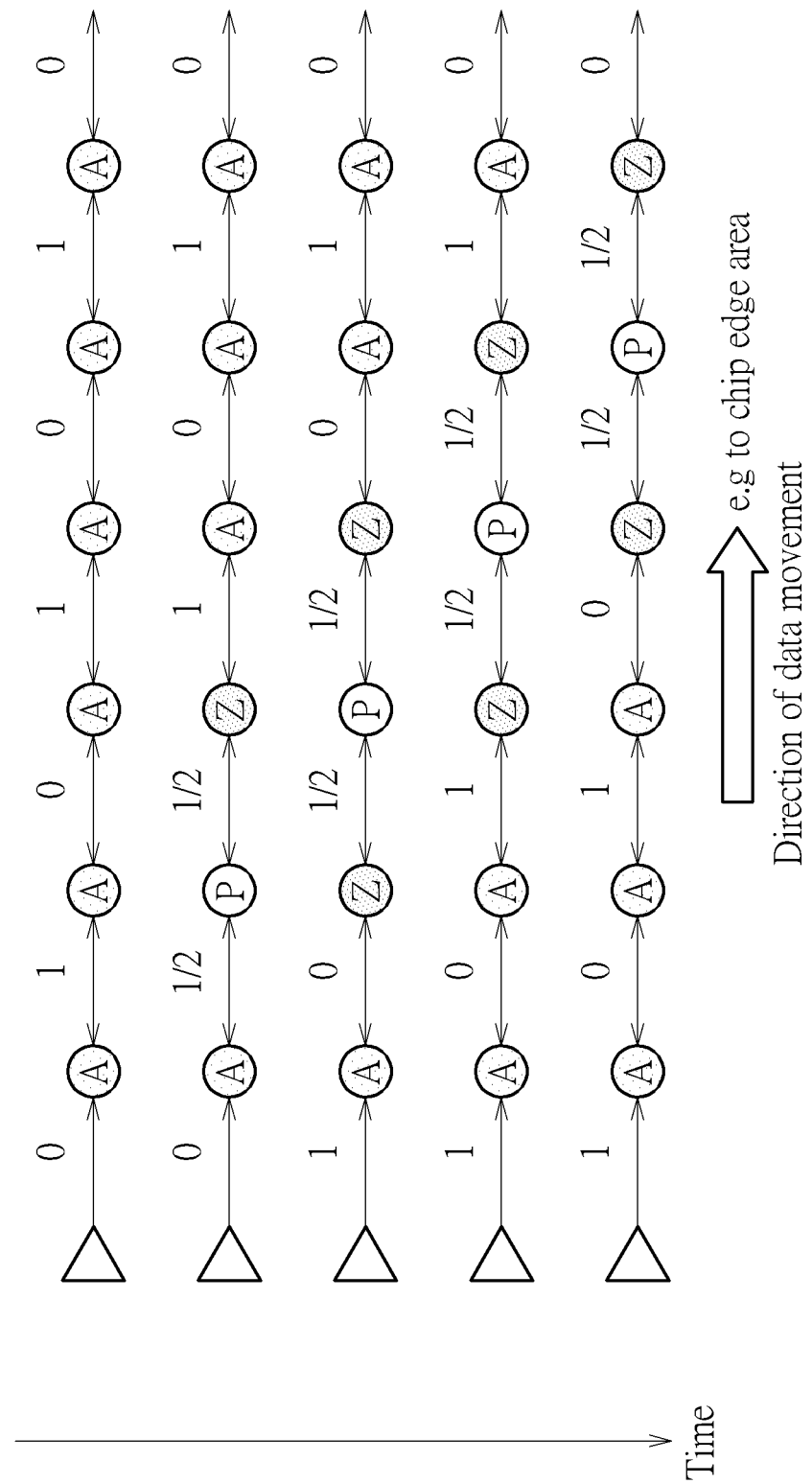
FIG. 9 illustrates application of the array data access scheme to a bank peripheral.

FIG. 9 illustrates application of the array data access scheme to a chip peripheral—the long-range, wide-bus, power-efficiency data movement scheme.

FIG. 9 is similar in notation to FIG. 8, except that FIG. 9 shows the voltage values being propagated across the BLSAs. Because the BLSA amplifies a read value and effectively reproduces it as either a "1" or a "0", due to precharging of the circuits to ½ VDD, voltages being propagated have a maximum swing of ½ as seen in the figure.

This feature provides benefits compared with a CMOS repeated of data being copied/moved to the chip edge area with a ½ voltage swing. Compared with the traditional small swing IF, here there is no DC current consumption from a receiver for receiving the small swing signal, yet is as robust as a fully differential IF (no Vref or ½ $V_{IF}$ need as in small swing IF.

In short, after a word line is selected and the charge of memory cells are loaded onto the bit-lines, the signals on these bit-lines in the first cell array section of a memory array can be amplified and latched by enabling the BLSA between the first section and a section adjacent to the first section, causing latched voltages to propagate to bit-lines in the second section. In the same way, voltages propagated to the bit lines in the second section can be propagated further to the third section using the latches between the second section and a third section. Voltages can be propagated sequentially from section to subsequent adjacent section until the target location is reached. The scheme can be applied as a method of page-data write access in a memory chip, of which page data can be propagated sequentially originally from page registers to the neighboring section, and from this section to subsequent section adjacent to it until a target section is reached, activating a word-line in the target section of the memory comprising the target word-line to write data in a form of voltage to the memory cells of the target word-line in the target section.

One example apparatus that can benefit from the use of the described page-copy scheme is an inference/AI accelerator.

As with most neural networks, CNNs are computationally intensive with high power consumption. Some estimates put the required transfers of data as consuming as much as 90-99% of the total power consumption and runtime of the neural network, making a reduction in either the number of data transfer and/or the distance of these data transfers a goal in the industry.

CNNs differ from many types of neural networks in that they are not fully connected. Thus, an inputted image can usually be divided into windows at least until nearing or reaching the output layer. For this reason, at least most of the layers of processing in a CNN can be done with single window at a time until the result of the window is a single outcome. Obviously, more than one window can be processed at a time in parallel or similarly, but the processing of each window through the layers of the CNN does not involve the processing of any other window. This separate processing of the windows can be called localized dataflow. This same localized dataflow can also be applied to separately to each channel in a multi-channel CNN, such as processing RGB colors in an RGB color input image separately.

Figure 10A:
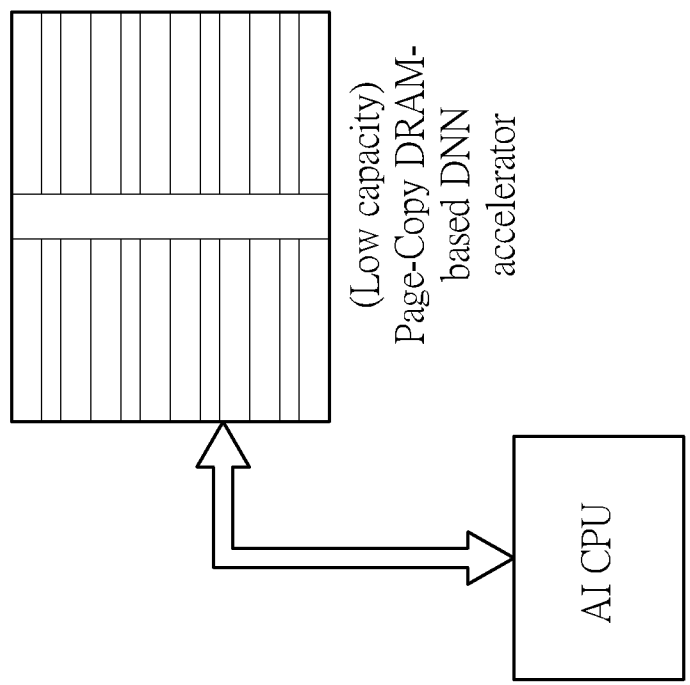
FIG. 10A illustrates an inference/AI accelerator coupled to a central processing unit to handle machine learning tasks.
Figure 10B:
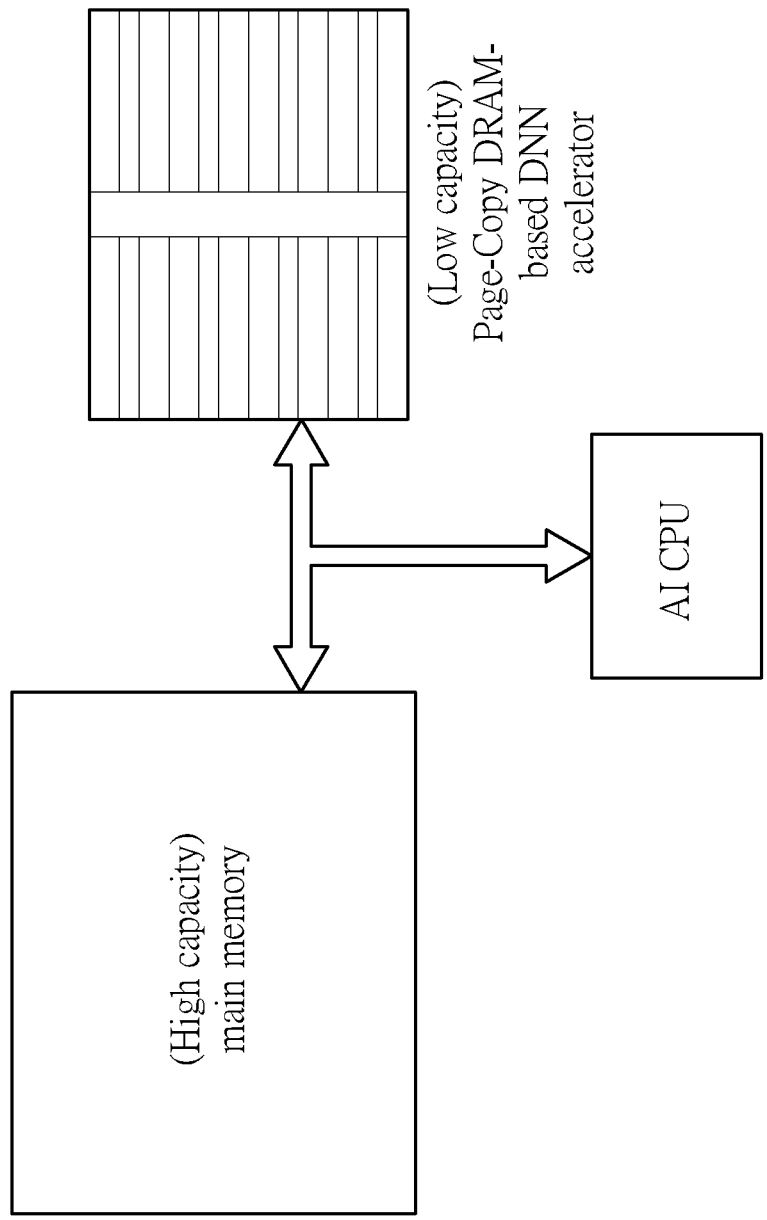
FIG. 10B illustrates an inference/AI accelerator coupled to a central processing unit and a high-capacity main memory to handle machine learning tasks which involves a large volume of data.

The inference/AI accelerator may be coupled to and operated in conjunction with a central processing unit as seen in FIG. 10A. Also, it may be coupled to and operated in conjunction with a central processing unit and a high-capacity main memory to handle machine learning tasks involving a large amount of data as seen in FIG. 10B. In some embodiments, the page registers, the processing element, and the memory cell array are embedded in a same semiconductor chip. In other embodiments, the page registers, the processing element, and the memory cell array are implemented in at least two different semiconductor chips and are coupled to each other through inter-chip bonding methodologies.

Figure 11:
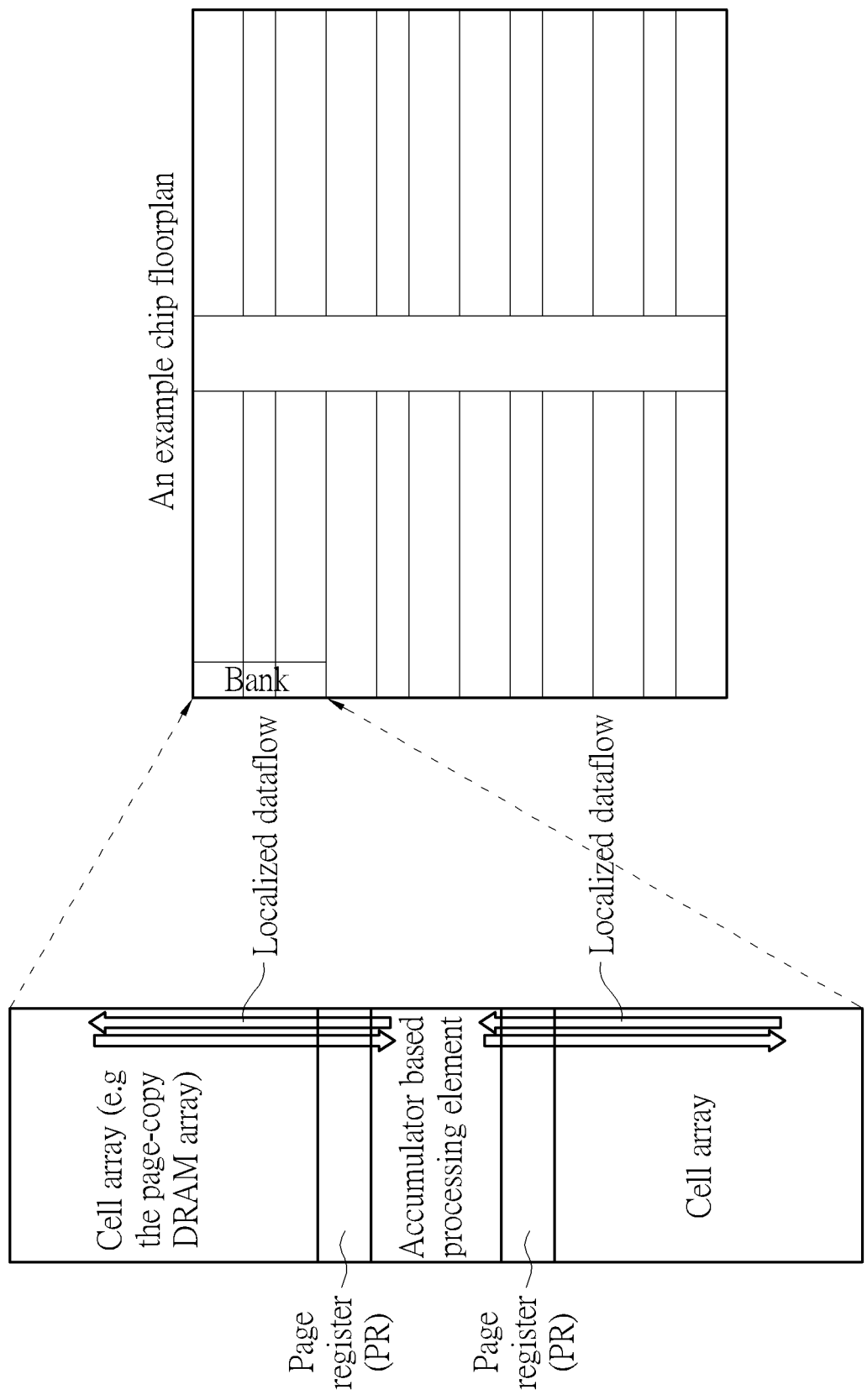
FIG. 11 is a block diagram for implementing an example chip floor plan for an inference/AI accelerator with localized dataflow.

FIG. 11 is a block diagram for implementing an example chip floor plan that can be applied to an inference/AI accelerator utilizing localized dataflow. As shown in FIG. 11, the basic chip floor plan divides the chip into a plurality of units, with each unit including two memory cell arrays and a processing block. Each unit may be used to independently process a single window of data. Each memory cell array may be a dynamic random access memory array (DRAM), although the chip floor plan is not limited to comprising DRAM.

The processing block includes a plurality of page registers sandwiching a connected processing element as shown in FIG. 11. Another side of each of the plurality of page registers is attached to an edge section of a respective one of the two memory cell arrays. The plurality of page registers is configured to access data from, and write data into, the attached memory cell array utilizing the page-copy scheme previously described. The processing element is configured to process the conditionally access data from the plurality of page registers which is depending on the Weights or contents of a filter. The processing element may perform data accumulations of different channels respectively.

The page registers and sections of the processing block nearest the page registers can be assigned as cache memories for arithmetic operations. Each of the memory cell arrays comprise row decoders and column decoders coupled to the memory cell array. Through predetermined decoding sequences of the decoders, convolution in the convolutional neural network is accomplished in conjunction with arithmetic operations executed in the processing block.

A page of data from the top (as shown in FIG. 11) cell array is accessed utilizing the page-copy scheme and stored in the page registers adjacent to the processing element. The processing element processes conditionally accessed data stored in a page register and stores the result in another page register. After that, the stored result data is subsequently stored in the cell array utilizing the page-copy scheme. The data flow can be repeated as often as necessary to complete processing of the localized dataflow without requiring any long distance transfer of data.

Figure 12:
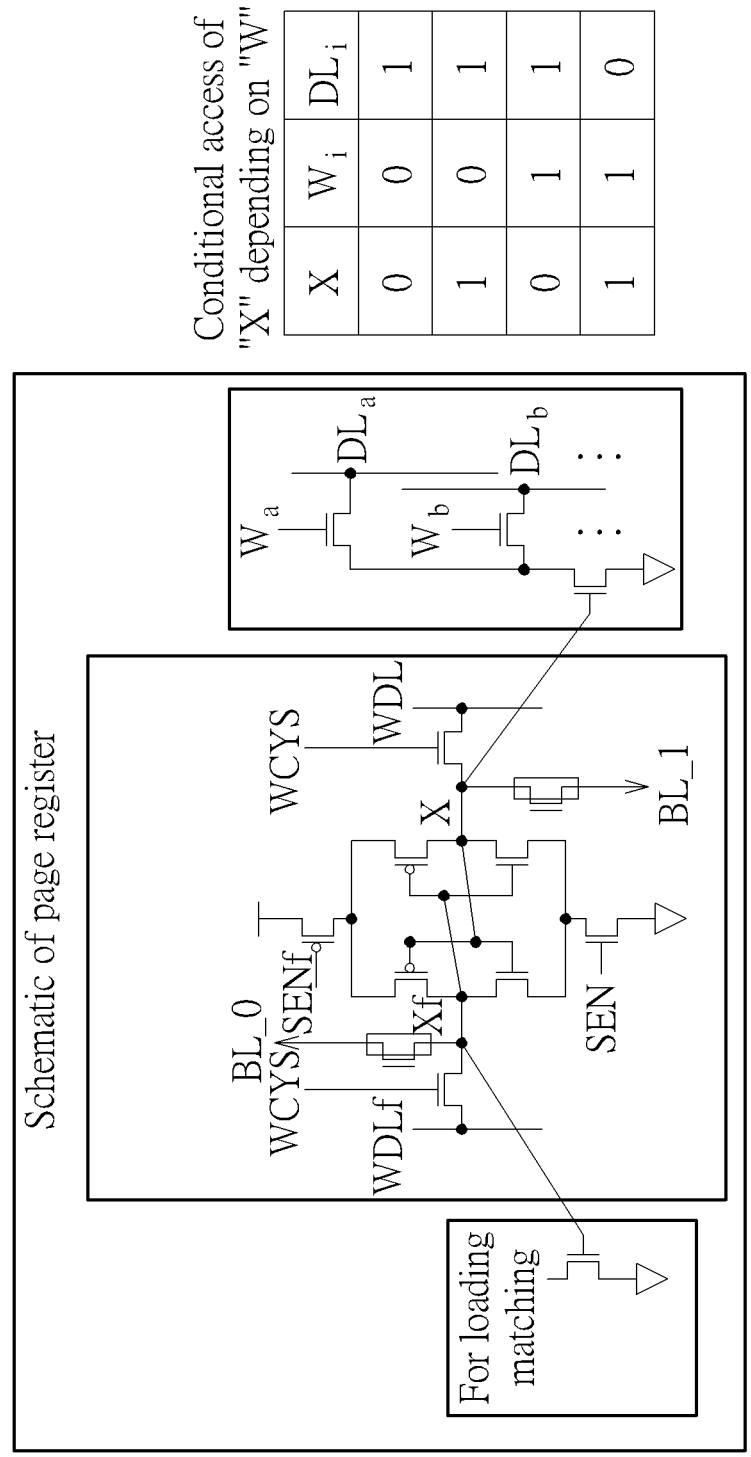
FIG. 12 illustrates a page register utilized to conditionally access the stored data.

The conditionally accessed dataflow alluded to above is meant to further reduce data transfers, energy consumed for data movement, and complexities by using addition to replace multiplication in the processing of each layer. This is done with the use of page data registers, such as shown in FIG. 12, which permit conditional access of "X" (e.g. the feature map data) depending on "W" (e.g. the Weights data).

Figure 13:
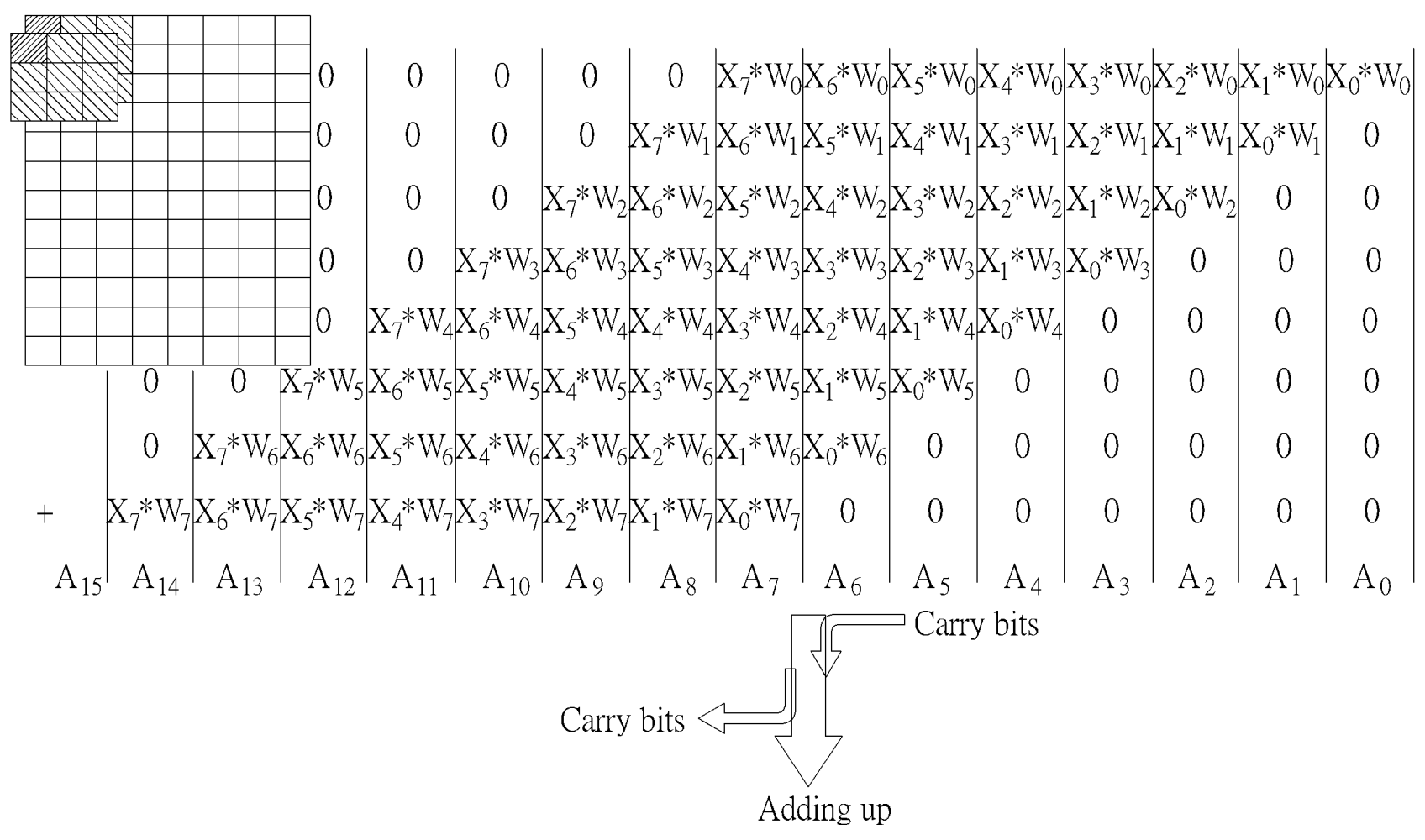

The idea is to only access data that permits the processing element to sum up the conditionally accessed data to achieve the same result as using multiplication as shown in FIG. 13. For example, 8-bit data times 8-bit data can be represented as a vector with 8 elements, X0-X7, and another vector with another 8 elements, W0-W7, to get the result in 16-bit vector data. The page registers of FIG. 12 can be controlled to conditionally access the bitwise multiplication data to compute digits of the 16-bit resulting vector data as shown in FIG. 13. For example, consider the result for bit A3. This requires the sum of X3*W0, X2*W1, X1*W2 and X0*W3. It is noted that X3*W0 meaning the product of two bits, X3 and W0.

The data accumulated by a processing block as a multiplication result can then be copied to the page registers of the in-situ processing block or to the page registers in the neighboring processing block. As data transfers constitute as much as 90-99% of power used in a convolutional neural network, this method of page-copy in conjunction with conditional access results in a significant power savings.

In short the conditionally accessed data includes the access of $X_i$ (the page data stored in a row of a memory cell array) through the activation of a selection bit represented as $W_j$, such that the accessed data is $X_i*W_j$ (i.e. bit $X_i$ AND with bit $W_j$) instead of a native $X_i$, and the summation of the conditionally accessed data, $X_i*W_j$, in a specific arrangement is equal to the multiplication of two vectors, X*W. Additionally, the conditionally accessed data includes the access of $X_i$ (the page data stored in a row of a memory cell array) through the activation of a multiple number of selection bits represented as ($W_j$, $W_{j+1}$, $W_{j+2}$, . . . ) are ($X_i*W_j$, $X_i*W_{j+1}$, $X_i*W_{j+2}$, . . . ), and the summation of these conditionally accessed data in a specific arrangement is equal to the multiplication of two vectors, X*W.

Figure 14A:
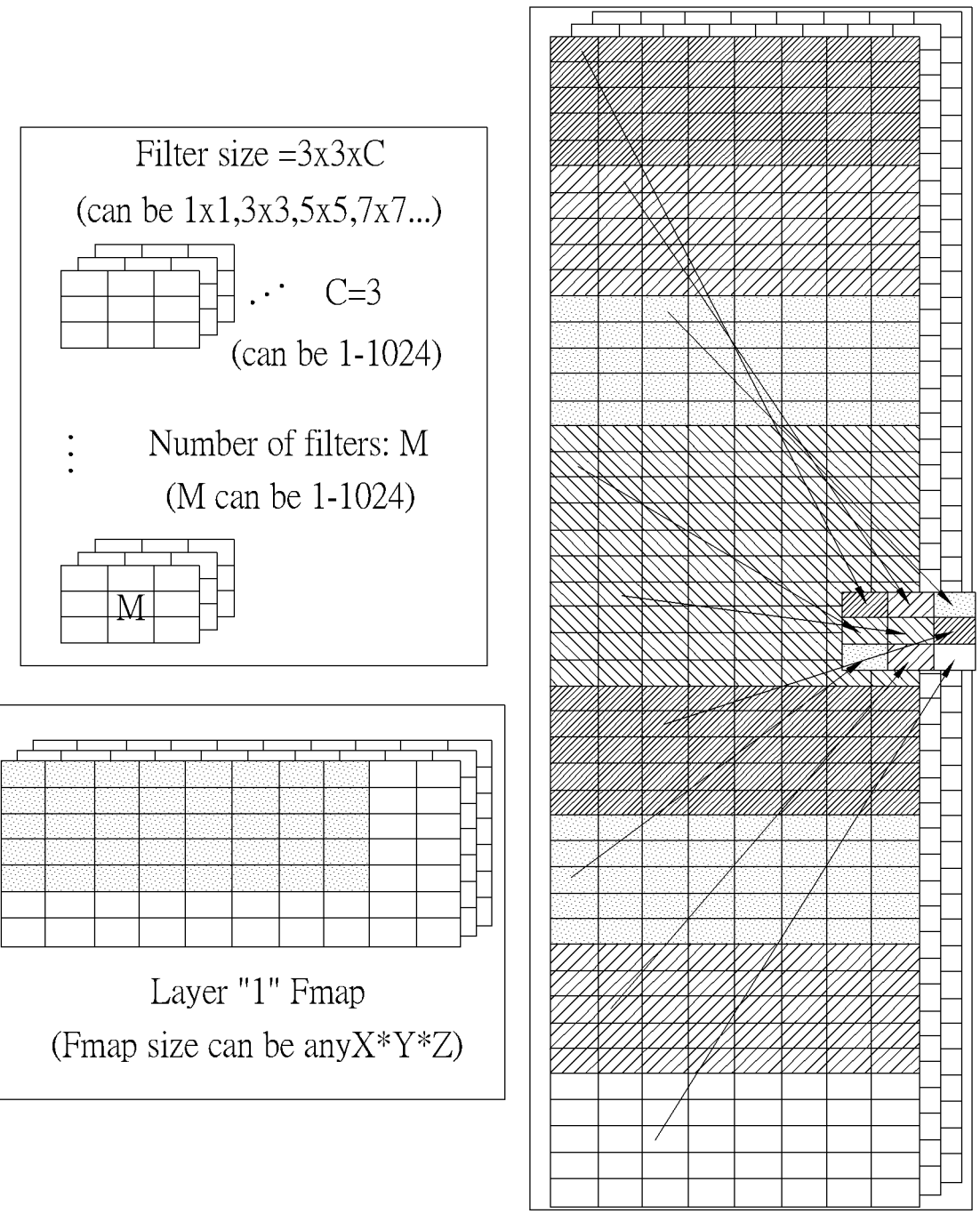
FIGS. 14A and 14B respectively illustrate multiplication of data in a memory with a filter where a filter size of 3×3λ3 is used.
Figure 14B:
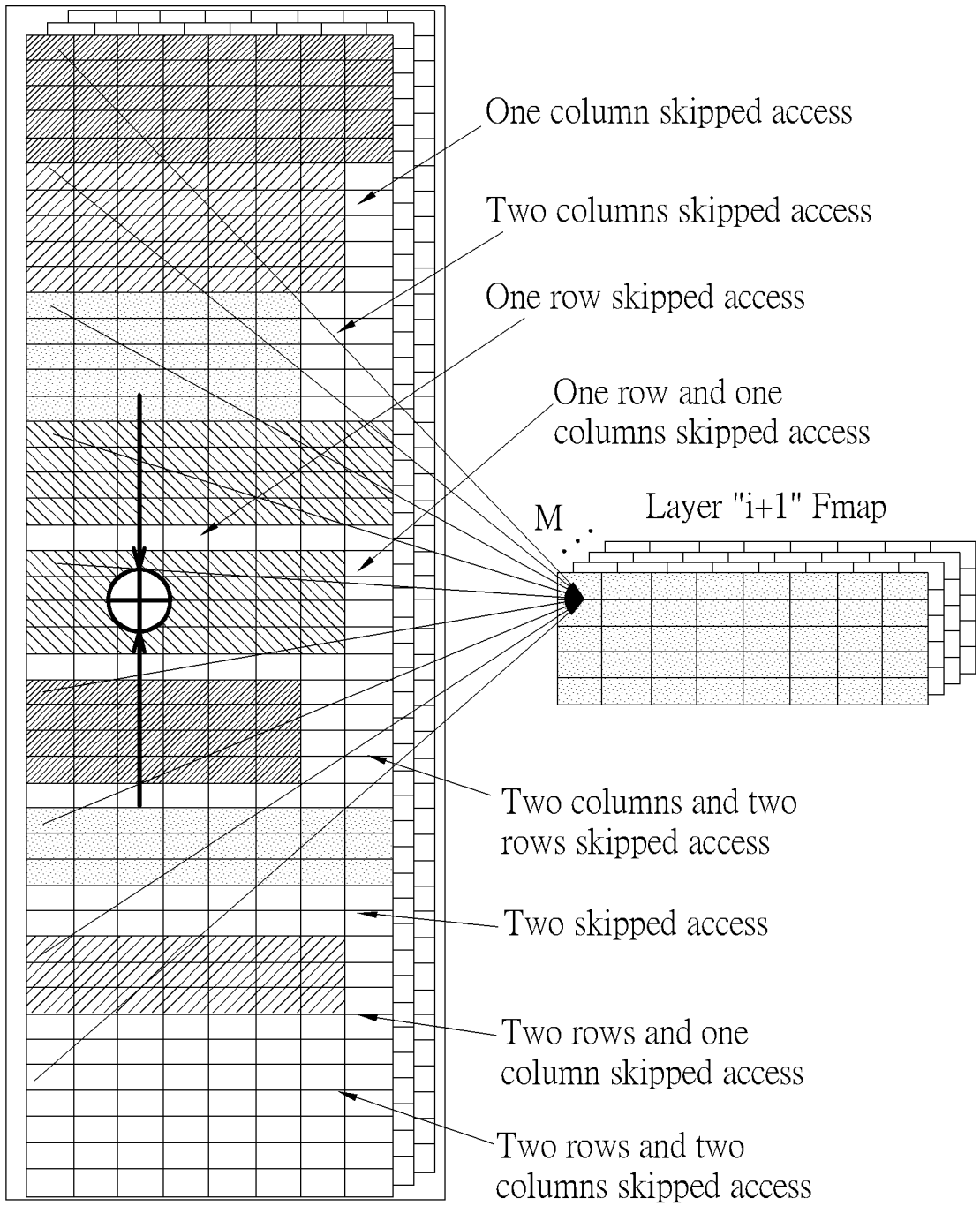

FIGS. 14A and 14B respectively illustrate the process of convolution. In the example of FIG. 14A, a filter size of 3×3×3 is used, applied to 3 channels of the input data. In the right side of the figure, because the filter size of a channel is 3×3, map pixel data of a channel will be multiplied by one of the nine pixel data of the 3×3 matrix, expanding to nine maps, and then, be stored in the memory array, or, in the cache section which is the nearest section to the processing element through memory access scheme, e.g., that utilizing the page-copy scheme.

FIG. 14B illustrates the summation of pixel-wise multiplied data stored in the corresponding memory array positions with the skipping of columns and/or rows of data for matching the processing of that convolution window.

In summary, page data can be propagated sequentially from a section to the neighboring section, and from this section to subsequent section adjacent to it until a target section is reached. In an apparatus based on this page-data-copy scheme, access data from a page register (which is also used for storing the data accessed using the page-data-copy scheme) with a conditional read-access method in conjunction with an arithmetic unit can execute the arithmetic process of deep convolutional neural network (DCNN) with minimum data movement. This minimum data movement is necessary to achieve high performance and high energy efficiency in an AI system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
a memory cell array comprising a plurality of memory sections;
a plurality of row/page registers connected to a section of the plurality of memory sections; and
a processing element coupled to the plurality of row/page registers;

wherein:
page data is accessed from and written to the plurality of memory sections through the plurality of row/page registers based on a page-copy scheme;
the page data is accessed from the plurality of row/page registers through activation of a page-register selection signal, which is represented as $W_j$, such that accessed data is $X_i*W_j$ instead of a native $X_j$, and a summation of conditionally accessed data, $X_iW_j$, in a specific arrangement, which is conducted in the processing element, is equal to a product of two vectors, X*W.

2. The apparatus of claim 1 wherein the memory cell array comprises row decoders and row/page registers coupled to the memory cell array and through predetermined decoding sequences of the row decoders and through conditionally selections of the row/page registers, matrix-vector multiplication (MV), matrix-matrix multiplication (MM) or in-place convolution (CONV) are accomplished in conjunction with the arithmetic operations executed in the processing element.

3. The apparatus of claim 1, wherein the processing element performs data accumulations of different channels respectively.

4. The apparatus of claim 1, wherein sections of the memory cell array near the row/page registers are assigned as cache sections for rapid storing and/or accessing of data.

5. The apparatus of claim 1 being operated in conjunction with a central processing unit to handle machine learning tasks.

6. The apparatus of claim 1, wherein the row/page registers, the processing element, and the memory cell array are embedded in a same semiconductor chip.

7. The apparatus of claim 1, wherein the row/page registers, the processing element, and the memory cell array are implemented in at least two different semiconductor chips and the semiconductor chips are coupled to each other.

8. The apparatus of claim 1, wherein the memory cell array is a cell array of dynamic random access memory (DRAM).

9. The apparatus of claim 1, wherein page-copy accessed data $X_i$ is latched in a row/page register, and through activation of a multiple number of selection bits, which are represented as the elements of a vector W($W_j$, $W_{j+1}$, $W_{j+2}$, . . . ) and which are coupled to the same row/page register such that accessed data are represented as elements of a vector $X_iW$ or ($X_iW_j$, $X_iW_{j+1}$, $X_iW_{j+2}$, . . . ) instead of native data $X_i$, the summation of these conditionally accessed data in a specific arrangement is equal to the multiplication of two vectors X and W.

10. The apparatus of claim 1, wherein the data accumulated by a processing element is written to a plurality of row/page registers in conjunction to another memory section.

11. An apparatus for page data accessing in a memory chip, the apparatus comprising:
a plurality of memory banks, each memory bank comprising a plurality of memory sections, each memory section comprising a plurality of memory cells coupled by a word line, each memory cell of a memory section having a bit line electrically coupled or selectively electrically coupled to a bit line of a memory cell in an adjacent memory section via a first latch module located at an end of the bit line and electrically coupled or selectively electrically coupled to a bit line of another memory cell in another adjacent memory section via a second latch module located at another end of the bit line; and continuously the bit line of the memory cell of the adjacent memory section being coupled to a bit line in a next memory section through a next propagating latch module until a bit line at a target memory section of the memory bank is reached; and a propagating control unit and a routing control unit, coupled to the latch module of each memory section, and arranged to perform signal propagating through bit lines;

wherein a first bit line in a first memory section is coupled to a first terminal of first conducting media of the first latch module, a second terminal of the first conducting media of the first latch module is coupled to a latch circuitry of the first latch module, the latch circuitry of the first latch module is coupled to a first terminal of fourth conducting media of the first latch module, and a second terminal of the fourth conducting media of the first latch module is coupled to a second bit line in a second memory section.

12. The apparatus of claim 11, wherein the second bit line in the second memory section is coupled to a first terminal of third conducting media of the second latch module, a second terminal of the third conducting media of the second latch module is coupled to a latch circuitry of the second latch module, the latch circuitry of the second latch module is coupled to a first terminal of second conducting media of the second latch module, and a second terminal of the second conducting media of the second latch module is coupled to a first bit line in a third memory section.

13. The apparatus of claim 12, wherein a material of the conducting media is a material similar to a material of the bit line, and the bit lines of several memory sections are coupled to each other through the latch modules in between.

* * * * *